(12) United States Patent
Park et al.

(10) Patent No.: US 11,359,272 B2
(45) Date of Patent: Jun. 14, 2022

(54) HARD FILM HAVING EXCELLENT WEAR RESISTANCE AND TOUGHNESS

(71) Applicant: KORLOY INC., Seoul (KR)

(72) Inventors: Je-hun Park, Cheongju-si (KR);
Seung-su Ahn, Cheongju-si (KR);
Seong-mo Park, Cheongju-si (KR);
Jin-han Gwon, Cheongju-si (KR);
Kyoung-il Kim, Cheongju-si (KR);
Beom-sik Kim, Cheongju-si (KR);
Sun-yong Ahn, Cheongju-si (KR)

(73) Assignee: KORLOY INC., Seoul (KR)

( * ) Notice: Subject to any disclaimer, the term of this patent is extended or adjusted under 35 U.S.C. 154(b) by 198 days.

(21) Appl. No.: 16/643,399

(22) PCT Filed: Jun. 15, 2018

(86) PCT No.: PCT/KR2018/006778
§ 371 (c)(1),
(2) Date: Feb. 28, 2020

(87) PCT Pub. No.: WO2019/045235
PCT Pub. Date: Mar. 7, 2019

(65) Prior Publication Data
US 2021/0071290 A1    Mar. 11, 2021

(30) Foreign Application Priority Data
Sep. 1, 2017 (KR) .......... 10-2017-0111611

(51) Int. Cl.
*C23C 14/06* (2006.01)
*C23C 14/32* (2006.01)
(Continued)

(52) U.S. Cl.
CPC ........ *C23C 14/0641* (2013.01); *C23C 14/325* (2013.01); *C23C 28/04* (2013.01);
(Continued)

(58) Field of Classification Search
CPC ....... C23C 28/00; C23C 28/04; C23C 28/042; C23C 28/044; C23C 28/048; C23C 28/30;
(Continued)

(56) References Cited

U.S. PATENT DOCUMENTS 6,071,560 A * 6/2000 Braendle ............. C23C 14/0021
427/580
2002/0168552 A1* 11/2002 Yamamoto .......... C23C 14/3414
427/248.1

(Continued)

FOREIGN PATENT DOCUMENTS

CN    107000068 A    8/2017
JP    08-209335 A    8/1996
(Continued)

OTHER PUBLICATIONS

Cong-Xiang Qin et al., "Influence of Si content on properties of TiAlSiN films prepared with arc ion plating", pp. 15-17, China Academic Journal Electroninc Publishing House, Nov. 11, 2005, China.

(Continued)

*Primary Examiner* — Z. Jim Yang
(74) *Attorney, Agent, or Firm* — Novick, Kim & Lee, PLLC; Jae Youn Kim; Jihun Kim

(57) ABSTRACT

The present invention relates to a hard film having improved wear resistance and improved toughness. A hard film according to the present invention is formed by using a PVD method on a surface of a base material, wherein: the hard film includes a first hard layer and a second hard layer; the first hard layer has a thickness of approximately 0.1-3.0 μm and is composed of $Ti_{1-a}Al_aN$ (0.3≤a≤0.7), and has a single phase structure; and the second hard layer has a thickness of approximately 0.5-10 μm and is composed of $Ti_{1-a-b}Al_aMe_bN$ (0.3≤a≤0.7, 0≤b≤0.05, the Me being at least one selected from V, Zr, Si, Nb, Cr, Mo, Hf, Ta and W);

(Continued)

according to an XRD phase analysis method, a ratio ([200]/[111]) of the intensity of a [200] peak to the intensity of a [111] peak is approximately 1.5 or higher; the second hard layer preferentially grows in a [200] direction; the [200] peak is located at approximately 42.7°-44.6° and is composed of three phases, and the [111] peak is located at approximately 37.0°-38.5° and is composed of three phases; and when a peak having a largest intensity among the peaks of the three phases is a main peak and remaining peaks are sub-peaks, a ratio (main peak/sub-peaks) of the intensity of the main peak to the intensities of the sub-peaks in a [200] face is approximately 2 or higher, and a ratio (main peak/sub-peaks) of the intensity of the main peak to the intensities of the sub-peaks in a [111] face is approximately 2 or higher.

4 Claims, 2 Drawing Sheets

(51) Int. Cl.
 C23C 28/00 (2006.01)
 C23C 28/04 (2006.01)
(52) U.S. Cl.
 CPC .......... *C23C 28/042* (2013.01); *C23C 28/044* (2013.01); *C23C 28/34* (2013.01); *C23C 28/345* (2013.01); *C23C 28/347* (2013.01)
(58) Field of Classification Search
 CPC . C23C 28/34; C23C 28/347; C23C 28/40–44; C23C 30/00; C23C 30/005; C23C 16/34; C23C 16/345; C23C 14/0641; C23C 14/0652; C04B 41/5062; C04B 41/5063; C04B 41/5068; C04B 35/58007; C04B 35/58014
 See application file for complete search history.

(56) References Cited

U.S. PATENT DOCUMENTS

| | | | |
|---|---|---|---|
| 2004/0105974 A1* | 6/2004 | Joelsson | C23C 30/005 428/698 |
| 2009/0123779 A1* | 5/2009 | Endler | C23C 30/00 427/255.391 |
| 2010/0233511 A1* | 9/2010 | Endler | C23C 28/044 427/249.19 |
| 2011/0020079 A1* | 1/2011 | Tabersky | C23C 14/0021 204/192.15 |
| 2011/0081539 A1* | 4/2011 | Ni | C23C 14/325 427/580 |
| 2012/0035045 A1* | 2/2012 | Fukushima | C04B 35/5831 501/96.4 |
| 2012/0128971 A1* | 5/2012 | Shibata | C23C 14/0664 204/192.12 |
| 2012/0219789 A1* | 8/2012 | Endler | C23C 16/36 428/335 |
| 2014/0234616 A1* | 8/2014 | Hultman | C23C 14/352 204/192.15 |
| 2014/0287209 A1* | 9/2014 | Kurapov | C23C 14/325 428/218 |
| 2015/0030406 A1* | 1/2015 | Andersson | C23C 14/0641 148/318 |
| 2015/0050490 A1* | 2/2015 | Kumar | C23C 14/325 106/286.2 |
| 2015/0064452 A1* | 3/2015 | Pitonak | C23C 16/34 427/256 |
| 2015/0211105 A1* | 7/2015 | Schier | C23C 28/042 428/141 |
| 2015/0308573 A1* | 10/2015 | Sato | F02F 5/00 277/443 |
| 2016/0053372 A1* | 2/2016 | Stiens | C23C 16/34 427/255.394 |
| 2017/0021429 A1* | 1/2017 | Paseuth | C23C 16/44 |
| 2017/0266733 A1* | 9/2017 | Sato | B23B 27/20 |
| 2018/0071829 A1* | 3/2018 | Hirano | C23C 28/042 |
| 2018/0071830 A1* | 3/2018 | Sato | C23C 28/42 |
| 2018/0119271 A1* | 5/2018 | Oden | C23C 14/0641 |
| 2018/0216224 A1* | 8/2018 | Stiens | C23C 16/56 |
| 2018/0245201 A1* | 8/2018 | Park | C23C 14/548 |
| 2018/0257147 A1* | 9/2018 | Tatsuoka | C23C 16/45523 |
| 2018/0305811 A1* | 10/2018 | Fukunaga | B23B 27/148 |
| 2018/0311742 A1* | 11/2018 | Tatsuoka | C23C 28/044 |
| 2018/0369927 A1* | 12/2018 | Nishizawa | B23B 27/148 |
| 2019/0040519 A1* | 2/2019 | Sato | C23C 14/0617 |
| 2019/0111495 A1* | 4/2019 | Maekawa | C04B 41/52 |
| 2019/0151956 A1* | 5/2019 | Paseuth | C23C 30/005 |
| 2019/0323118 A1* | 10/2019 | Andersson | C23C 14/325 |
| 2019/0358711 A1* | 11/2019 | Ishigaki | C23C 30/005 |
| 2019/0376174 A1* | 12/2019 | Yalamanchili | C23C 14/0641 |
| 2021/0108306 A1* | 4/2021 | Kurapov | C23C 14/0094 |

FOREIGN PATENT DOCUMENTS

| | | |
|---|---|---|
| JP | 2010-001547 A | 1/2010 |
| JP | 2013013979 A | 1/2013 |
| JP | 2015-124407 A | 7/2015 |
| JP | 2016036873 A | 3/2016 |
| KR | 10-1208838 B1 | 12/2012 |
| KR | 10-1753104 B1 | 7/2017 |
| WO | 2006-041367 A1 | 4/2006 |
| WO | WO-2016148056 A1 * | 9/2016 .......... C23C 28/044 |

OTHER PUBLICATIONS

Wei Li et al., "Influence of Si Content on Microstructure and Mechanical Properties of TiAlSiN Nanocomposite Coatings", Shanghai Nonferrous Metals, vol. 35, No. 2, pp. 52-56, Jun. 2014, China.
Jia Lia et al., "Effect of Al content on Crystalline Structure And Properties of (Ti,Al)N Coating", pp. 29-35, China Academic Journal Electronic Publishing House, China.

* cited by examiner

HARD FILM HAVING EXCELLENT WEAR RESISTANCE AND TOUGHNESS

BACKGROUND OF THE INVENTION

1. Field of the Invention

The present invention relates to a hard film having excellent wear resistance and toughness, and more particularly, to a hard film which includes a nitride thin film containing Ti and Al and which can be appropriately used for protective films for cutting tools.

2. Description of the Related Art

TiAlN, which is a nitride containing titanium (Ti) and aluminum (Al), is capable of securing oxidation resistance by using Al together with high hardness and is widely used for a hard film for protecting hard base materials such as cemented carbides.

In general, a TiAlN thin film is formed in a thickness of approximately 0.5-10 μm through a physical vapor deposition (hereinafter referred to as "PVD" method), and a thin film of a material such as AlCrN, AlTiN or metal oxides is formed on the TiAlN thin film according to a required physical property for a cutting tool.

However, the above-mentioned TiAlN has a single-phase form, in which Al is mixed as a solute in TiN, and cannot be formed in thick thickness without peeling, and thus, there is a limitation in imparting high hardness to a hard film.

For such reason, Japanese Patent Publication No. 2015-124407 discloses a hard film composed of a single or two or more layers, at least one layer of which includes a multilayer structure in which a first unit layer formed of $Ti_{1-x}Al_xN$ and a second unit layer formed of $Ti_{1-y}Al_yN$ are alternately laminated, x in the $Ti_{1-x}Al_xN$ satisfies $0<x<0.65$, the second unit layer has a hcp-type crystal structure, and y in the $Ti_{1-y}Al_yN$ satisfies $0.65 \leq y<1$. That is, the hardness and oxidation resistance of the TiAlN layer are to be enhanced through a form in which fcc phases and hcp phases are alternately and repeatedly laminated.

SUMMARY OF THE INVENTION

An object of the present invention is to provide a film for cutting tools which has further improved wear resistance and toughness than hard films or prior arts.

In order to address the abovementioned problem, the present invention provides a hard film formed by using a PVD method on a surface of a base material, wherein: the hard film includes a first hard layer and a second hard layer; the first hard layer has a thickness of approximately 0.1-3.0 μm and is composed of $Ti_{1-a}Al_aN$ ($0.3 \leq a \leq 0.7$), and has a single phase structure; and the second hard layer has a thickness of approximately 0.5-10 μm and is composed of $Ti_{1-a-b}Al_aMe_bN$ ($0.3 \leq a \leq 0.7$, $0 \leq b \leq 0.05$, and the Me is at least one selected from V, Zr, Si, Nb, Cr, Mo, Hf, Ta and W), and according to an XRD phase analysis method, a ratio ([200]/[111]) of an intensity of a [200] peak to an intensity of a [111] peak is approximately 1.5 or higher, and the second hard layer preferentially grows in a [200] direction; the [200] peak is located at approximately 42.7°-44.6° and is composed of three phases, and the [111] peak is located at approximately 37.0°-38.5° and is composed of three phases; and when a peak having a largest intensity among the peaks of the three phases is a main peak and remaining peaks are sub-peaks, a ratio (main peak/sub-peaks) of intensity of the main peak to intensities of the sub-peaks in a [200] face is approximately 2 or higher, and a ratio (main peak/sub-peaks) of the intensity of the main peak to the intensities of the sub-peaks in a [111] face is approximately 2 or higher.

DETAILED DESCRIPTION OF THE EXEMPLARY EMBODIMENTS

Figure 1:
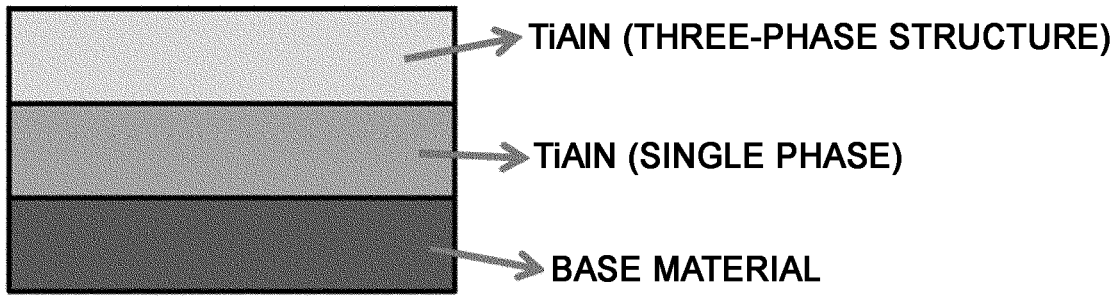
FIG. 1 is a schematic view illustrating a cross-sectional structure of a hard film according to a first embodiment of the present invention.

Hereinafter, embodiments of the present invention will be described with reference to the accompanying drawings. However, the embodiments of the present invention to be exemplary described below may, however, be embodied in different forms and the scope of the present invention should not be constructed as limited to the embodiments set forth herein. Rather, the embodiments of the present invention are provided so that this disclosure will be thorough and complete, and will fully convey the scope of the present invention to those skilled in the art.

A hard film according to the present invention is formed by using a PVD method on a surface of a base material, wherein: the hard film includes a first hard layer and a second hard layer; the first hard layer has a thickness of approximately 0.1-3.0 μm and is composed of $Ti_{1-a}Al_aN$ ($0.3 \leq a \leq 0.7$), and has a single phase structure; and the second hard layer has a thickness of approximately 0.5-10 μm and is composed of $Ti_{1-a-b}Al_aMe_bN$ ($0.3 \leq a \leq 0.7$, $0 \leq b \leq 0.05$, the Me is at least one selected from V, Zr, Si, Nb, Cr, Mo, Hf, Ta and W), and according to an XRD phase analysis method, a ratio ([200]/[111]) of the intensity of [111] peak to the intensity of [200] peak is approximately 1.5 or higher, and the second hard layer preferentially grows in a [200] direction; the [200] peak is located at approximately 42.7°-44.6° and is composed of three phases, and the [111] peak is located at approximately 37.0°-38.5° and is composed of three phases; and when a peak having a largest intensity among the peaks of the three phases is a main peak and remaining peaks are sub-peaks, a ratio (main peak/sub-peaks) of the intensity of the main peak to the intensities of the sub-peaks in a [200] face is approximately 2 or higher, and a ratio (main peak/sub-peaks) of the intensity of the main peak to the intensities of the sub-peaks in a [111] face is approximately 2 or higher.

The first hard layer is a layer for improving the binding force with the base material, and when the thickness thereof is smaller than approximately 0.1 μm, the function thereof is not sufficient, and when the thickness is larger than approximately 3.0 μm, the effect of the second hard layer is not sufficient, and therefore a thickness of approximately 0.1-3.0 μm is desirable.

In addition, the first hard layer is desirably composed of $Ti_{1-a}Al_aN$ ($0.3 \leq a \leq 0.7$), and when the content (a) of the Al is less than approximately 0.3, excellent binding force with the base material may be maintained, but the hardness and wear resistance of the first hard layer is degraded because the amount of substituted and mixed Al decreases, and when the content of the Al is greater than approximately 0.7, a brittle hcp phase that may degrade the binding force with the base material is formed and therefore a thickness of approximately 0.3-0.7 is desirable.

In addition, the second hard layer lacks in improvement of wear resistance and toughness when having a thickness of smaller than approximately 0.5 μm, and has degraded chipping resistance and toughness due to excessive compressive stress when having a thickness of larger than 10 μm, and therefore a thickness of approximately 0.5-10 μm is desirable.

In addition, the second hard layer is desirably composed of $Ti_{1-a-b}Al_aMe_bN$ (0.3≤a≤0.7, 0≤b≤0.05, the Me is at least one selected from V, Zr, Si, Nb, Cr, Mo, Hf, Ta and W), and when the content (a) of Al is less than approximately 0.3, the hardness and wear resistance of the second hard layer is degraded because the amount of substituted and mixed Al decreases, and when the content of the Al is greater than approximately 0.7, a brittle hcp phase is formed, so that the chipping resistance and the toughness degrades, and therefore a thickness of approximately 0.3-0.7 is desirable. In addition, some Me components may be added in the first hard layer, and when the added Me content (b) is no greater than approximately 5 at %, excellent binding force with a lower layer (first hard layer) is maintained, and it may be expected to achieve an improvement in wear resistance due to solution reinforcement or crystal grain refinement and a function of preventing heat generated during machining to be transferred to a base material or an appropriate lubrication effect during cutting, and when the added Me content is greater than approximately 5 at %, hardness and wear resistance increases, but the binding force with the lower layer (first hard layer) degrades due to an increase in differences in elastic modulus with the base material, plastic deformation resistance index, and the like, and appropriate chipping resistance and toughness for high hardness are not easily achieved, and therefore desirable content of added Me is no greater than approximately 5 at %.

In addition, the second hard layer may achieve improved wear resistance and toughness when a three-phase structure having a crystal structure preferentially grown in the [200] direction, the [200] peak and the [111] peak are in the abovementioned numerical ranges in the XRD phase analysis, three peaks are present in the respective numerical ranges, and the main peak among the peaks maintains a remarkably higher intensity state than other peaks (that is, a structure in which the crystal phase of the main peak is relatively more than the crystal phases of the sub-peaks by a certain amount). Therefore, it is desirable to satisfy the abovementioned numerical range. More desirably, the ratio (main peak/sub-peaks) of the intensity of the main peak to the intensities of the sub-peaks of the [200] face may be approximately 3-8, and the ratio (main peak/sub-peaks) of the intensity of the main peak to the intensities of the sub-peaks of the [111] face may be approximately 4-7.

In addition, the three-phase structure may desirably include a TiAlN phase, a TiN phase and an AlN phase.

In addition, the first hard layer may be desirably formed to have a single phase structure by being deposited in a DC method, and the second hard layer may be formed to have a three-phase mixed structure by applying a pulse bias.

In addition, on the second hard layer, a third hard layer including one or more compounds selected from $Al_{1-x}Cr_xN$ (0.3≤x≤0.7), $Al_{1-y}Ti_yN$ (0.3≤y≤0.7), and $Al_2O_3$ may be formed.

In addition, between the first hard layer and the second hard layer, a fourth hard layer having a structure of a single layer or a composite layer structure in which at least two single layers are laminated may be formed, wherein the single layer includes one or more compounds selected from $Al_{1-x}Cr_xN$ (0.3≤x≤0.7), $Al_{1-y}Ti_yN$ (0.3≤y≤0.7), and $Al_2O_3$.

In addition, in the third hard layer and the fourth hard layer, when the Cr(x) content of the $Al_{1-x}Cr_xN$ (0.3≤x≤0.7) is less than approximately 0.3, a lubrication effect of low friction coefficient may not be expected, and there is difficulty in deposition due to increased insulating property, and when the Cr(x) content is greater than approximately 0.7, a brittle hcp phase is formed and the chipping resistance and toughness degrade, a segregation of $Cr_2N$ is formed due to a high temperature generated in cutting and the wear resistance degrades, and therefore a Cr(x) content may favorably be approximately 0.3-0.7.

In addition, when the Ti(y) content of $Al_{1-y}Ti_yN$ (0.3≤y≤0.7) is less than approximately 0.3, the amount of substituting and mixed Al decreases and the harness and wear resistance degrades, and when the Ti(y) content is greater than approximately 0.7, a brittle hcp phase is formed and the chipping resistance and toughness degrades, and therefore the Ti(y) content of approximately 0.3-0.7 is desirable.

Hereinafter, the present invention will be described in more detail on the basis of preferable embodiments of the invention.

First Embodiment

FIG. 1 is a schematic view illustrating a cross-sectional structure of a hard film according to a first embodiment of the present invention. As illustrated in FIG. 1, in a hard film according to the first embodiment of the present invention, a first hard layer composed of $Ti_{1-a}Al_aN$ (0.3≤a≤0.7) is formed on a surface of a base material, and a layer having a three-phase mixed structure and having an overall composition of $Ti_{1-a-b}Al_aMe_bN$ (0.3≤a≤0.7, 0≤b≤0.05) is formed on the first hard layer.

At this point, the base material on which the hard film is formed was formed by using a WC-10 wt % Co cemented carbide with a model number of APMT1604PDSR-MM.

In addition, each of the thin films constituting the hard films was formed by using an arc ion plating method, which is a physical vapor deposition (PVD) method, and/or using a reactive magnetron.

Specifically, the arc ion plating was performed on a cemented carbide substrate formed of WC-10 wt % Co by using AlTi, and TiAl arc target, and at this point, the initial vacuum pressure was approximately $8.5 \times 10^{-5}$ Torr or less, $N_2$ was injected as a reaction gas, and the deposition temperature was approximately 400-550° C. The first hard layer was deposited by using a method of applying a DC voltage, the second hard layer was deposited by using a method of applying a pulse voltage, the nitrides of the third hard layer or the fourth hard layer was deposited by applying a DC voltage or a pulse voltage, the oxide films of the hard layers were deposited by using a method of applying a bipolar pulse voltage, and the specific deposition conditions are shown in Tables 1-4 below.

The deposition conditions may vary according to characteristics and conditions of equipment, but when the first hard layer has a single-phase structure and the second hard layer has a three-phase mixed structure, this should be understood to belong to the scope of the present invention.

In addition, of course, thin films having various shapes may further be formed on the second hard layer is necessary, and since the hard film according to an embodiment of the present invention is formed by using a physical vapor deposition (PVD) method, the thickness of the thin films may be formed to be maximum of approximately 10 μm.

TABLE 1

| Division | Laminate structure | Deposited thin film | Thin film composition (at %) | Layer thickness | Table Bias | Frequency | Duty cycle |
|---|---|---|---|---|---|---|---|
| Comparative example 1 | First layer | TiAlN deposited by using arc | Ti:Al = 50:50 (at %) | 0.5 μm | DC 30 V | — | 100% |
| | Second layer | TiAlN deposited by using arc | Ti:Al = 70:30 (at %) | 3 μm | Pulse 40 V | 30 kHz | 50~80% |
| Example 1 | First layer | TiAlN deposited by using arc | Ti:Al = 50:50 (at %) | 0.5 μm | DC 30 V | — | 100% |
| | Second layer | TiAlN deposited by using arc | Ti:Al = 67:33 (at %) | 3 μm | Pulse 40 V | 30 kHz | 50~80% |
| Example 2 | First layer | TiAlN deposited by using arc | Ti:Al = 50:50 (at %) | 0.5 μm | DC 30 V | — | 100% |
| | Second layer | TiAlN deposited by using arc | Ti:Al = 40:60 (at %) | 3 μm | Pulse 40 V | 30 kHz | 50~80% |
| Example 3 | First layer | TiAlN deposited by using arc | Ti:Al = 50:50 (at %) | 0.5 μm | DC 30 V | — | 100% |
| | Second layer | TiAlN deposited by using arc | Ti:Al = 33:67 (at %) | 3 μm | Pulse 40 V | 30 kHz | 50~80% |
| Comparative example 2 | First layer | TiAlN deposited by using arc | Ti:Al = 50:50 (at %) | 0.5 μm | DC 30 V | — | 100% |
| | Second layer | TiAlN deposited by using arc | Ti:Al = 30:70 (at %) | 3 μm | Pulse 40 V | 30 kHz | 50~80% |

Comparative examples 1 and 2 are the same as examples 1-3 of the present invention in the aspect that the first hard layer was formed by a DC method and the second hard layer was formed by using a pulse method, but in terms of compositions, comparative examples 1 and 2 are different form examples 1-3 of the present invention.

Table 2 shows thin film compositions and deposition conditions of examples 10-20 of the present invention.

TABLE 2

| Division | Laminate structure | Deposited thin film | Thin film composition (at %) | Layer thickness | Table Bias | Frequency | Duty cycle |
|---|---|---|---|---|---|---|---|
| Example 10 | First layer | TiAlN | Ti:Al = 50:50 (at %) | 0.5 μm | DC 30 V | — | 100% |
| | Second layer | TiAlSiN | Ti:Al:Si = 43:56:1 (at %) | 3 μm | Pulse 40 V | 30 kHz | 50~80% |
| Example 11 | First layer | TiAlN | Ti:Al = 50:50 (at %) | 0.5 μm | DC 30 V | — | 100% |
| | Second layer | TiAlSiN | Ti:Al:Si = 43:54:3 (at %) | 3 μm | Pulse 40 V | 30 kHz | 50~80% |
| Example 12 | First layer | TiAlN | Ti:Al = 50:50 (at %) | 0.5 μm | DC 30 V | — | 100% |
| | Second layer | TiAlSiN | Ti:Al:Si = 43:52:5 (at %) | 3 μm | Pulse 40 V | 30 kHz | 50~80% |
| Comparative Example 8 | First layer | TiAlN | Ti:Al = 50:50 (at %) | 0.5 μm | DC 30 V | — | 100% |
| | Second layer | TiAlSiN | Ti:Al:Si = 43:50:7 (at %) | 3 μm | Pulse 40 V | 30 kHz | 50~80% |
| Example 13 | First layer | TiAlN | Ti:Al = 50:50 (at %) | 0.5 μm | DC 30 V | — | 100% |

TABLE 2-continued

| Division | Laminate structure | Deposited thin film | Thin film composition (at %) | Layer thickness | Table Bias | Frequency | Duty cycle |
|---|---|---|---|---|---|---|---|
| | Second layer | TiAlVN | Ti:Al:V = 43:52:5 (at %) | 3 μm | Pulse 40 V | 30 kHz | 50~80% |
| Example 14 | First layer | TiAlN | Ti:Al = 50:50 (at %) | 0.5 μm | DC 30 V | — | 100% |
| | Second layer | TiAlZrN | Ti:Al:Zr = 43:52:5 (at %) | 3 μm | Pulse 40 V | 30 kHz | 50~80% |
| Example 15 | First layer | TiAlN | Ti:Al = 50:50 (at %) | 0.5 μm | DC 30 V | — | 100% |
| | Second layer | TiAlNbN | Ti:Al:Nb = 43:52:5 (at %) | 3 μm | Pulse 40 V | 30 kHz | 50~80% |
| Example 16 | First layer | TiAlN | Ti:Al = 50:50 (at %) | 0.5 μm | DC 30 V | — | 100% |
| | Second layer | TiAlMoN | Ti:Al:Mo = 43:52:5 (at %) | 3 μm | Pulse 40 V | 30 kHz | 50~80% |
| Example 17 | First layer | TiAlN | Ti:Al = 50:50 (at %) | 0.5 μm | DC 30 V | — | 100% |
| | Second layer | TiAlCrN | Ti:Al:Cr = 43:52:5 (at %) | 3 μm | Pulse 40 V | 30 kHz | 50~80% |
| Example 18 | First layer | TiAlN | Ti:Al = 50:50 (at %) | 0.5 μm | DC 30 V | — | 100% |
| | Second layer | TiAlHfN | Ti:Al:Hf = 43:52:5 (at %) | 3 μm | Pulse 40 V | 30 kHz | 50~80% |
| Example 19 | First layer | TiAlN | Ti:Al = 50:50 (at %) | 0.5 μm | DC 30 V | — | 100% |
| | Second layer | TiAlTaN | Ti:Al:Ta = 43:52:5 (at %) | 3 μm | Pulse 40 V | 30 kHz | 50~80% |
| Example 20 | First layer | TiAlN | Ti:Al = 50:50 (at %) | 0.5 μm | DC 30 V | — | 100% |
| | Second layer | TiAlWN | Ti:Al:W = 43:52:5 (at %) | 3 μm | Pulse 40 V | 30 kHz | 50~80% |

In examples 10-20 of Table 2 above, thin films are formed in which a small quantity of metal elements are mixed as a solute in TiAlN of a second hard layer.

Table 3 shows thin film compositions and deposition conditions of comparative examples 3-5.

TABLE 3

| Division | Laminate structure | Deposited thin film | Thin film composition (at %) | Layer thickness | Table Bias | Frequency | Duty cycle |
|---|---|---|---|---|---|---|---|
| Comparative example 3 | First layer | TiAlN | Ti:Al = 50:50 (at %) | 0.5 μm | DC 30 V | — | 100% |
| | Second layer | TiAlN | Ti:Al = 40:60 (at %) | 3 μm | DC 40 V | — | 100% |
| Comparative example 4 | First layer | TiAlN | Ti:Al = 50:50 (at %) | 0.5 μm | Pulse 30 V | 30 kHz | 50~80% |
| | Second layer | TiAlN | Ti:Al = 40:60 (at %) | 3 μm | Pulse 40 V | 30 kHz | 50~80% |

TABLE 3-continued

| Division | Laminate structure | Deposited thin film | Thin film composition (at %) | Layer thickness | Table Bias | Frequency | Duty cycle |
|---|---|---|---|---|---|---|---|
| Comparative example 5 | First layer | TiAlN | Ti:Al = 50:50 (at %) | 0.5 μm | DC 30 V | — | 100% |
| | Second layer | TiAlN | Ti:Al = 40:60 (at %) | 3 μm | Pulse 40 V | 30 kHz | 90% |

In Table 3 above, a first hard layer and a second hard layer were both formed by using a DC method, a first hard layer and a second hard layer were both formed by using a pulse method in comparative example 4, and a first hard layer was formed by using the DC method and a second hard layer was formed by using a pulse method in comparative example 5, but comparative examples 3 to 5 are examples in which the second hard layer cannot have a three-phase structure. That is, in terms of crystal structures, comparative examples differ from examples 1-3 of the present invention.

Second Embodiment

Figure 2:
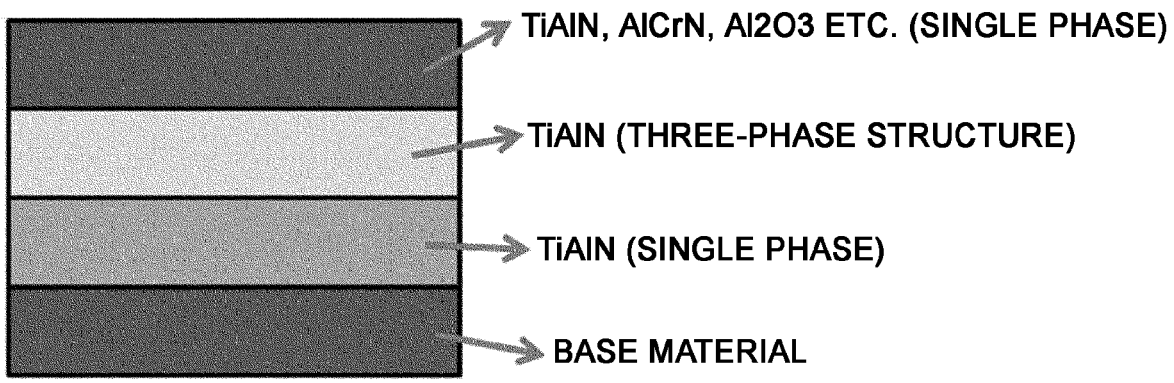
FIG. 2 is a schematic view illustrating a cross-sectional structure of a hard film according to a second embodiment of the present invention.

FIG. 2 is a schematic view illustrating a cross-sectional structure of a hard film according to a first embodiment of the present invention. As illustrated in FIG. 2, in a hard film according to the second embodiment of the present invention, a first hard layer is formed, a second hard layer having a three-phase mixed structure on the first hard layer, and then a third hard layer is further formed which is composed of a single layer or a multilayer to improve physical properties.

As such, when forming a composite multilayer structure by forming the third hard layer on the second hard layer, milling wear resistance or milling shock resistance can be achieved that is further improved than those in the case of forming only the second hard layer on the first hard layer, and therefore this is desirable.

The first hard layer and the second hard layer are the same as the first embodiment, and TiAlN and AlCrN that constitute the third hard layer and the fourth hard layer were formed by suing arc ion plating, and aluminum oxide was formed by using a reactive magnetron sputtering method. Specific conditions for thin film composition and deposition are shown in Table 4 below.

TABLE 4

| Division | Laminate structure | Deposited thin film | Thin film composition (at %) | Layer thickness | Table Bias | Frequency | Duty cycle |
|---|---|---|---|---|---|---|---|
| Comparative example 6 | First layer | TiAlN | Ti:Al = 50:50 (at %) | 0.5 μm | DC 30 V | — | 100% |
| | Second layer | TiAlN | Ti:Al = 40:60 (at %) | 2 μm | DC 40 V | — | 100% |
| | Third layer | AlCrN | Cr:Al = 30:70 (at %) | 1 μm | DC 60 V | — | 100% |
| Comparative example 7 | First layer | TiAlN | Ti:Al = 50:50 (at %) | 2.5 μm | DC 40 V | — | 100% |
| | Second layer | Aluminum oxide | Al = 100, Al2O3 | 0.5 μm | 125 V | 50~80 kHz | 50% |
| | Third layer | TiAlN | Ti:Al = 40:60 (at %) | 1.5 μm | DC 40 V | — | 100% |
| Example 4 | First layer | TiAlN | Ti:Al = 50:50 (at %) | 0.5 μm | DC 30 V | — | 100% |
| | Second layer | TiAlN | Ti:Al = 40:60 (at %) | 2 μm | Pulse 40 V | 30 kHz | 50~80% |
| | Third layer | AlCrN | Cr:Al = 30:70 (at %) | 1 μm | DC 60 V | — | 100% |
| Example 5 | First layer | TiAlN | Ti:Al = 40:60 (at %) | 0.5 μm | DC 40 V | — | 100% |
| | Second layer | TiAlN | Ti:Al = 40:60 (원자%) | 2 μm | Pulse 40 V | 30 kHz | 50~80% |
| | Third layer | Aluminum oxide | Al = 100, Al₂O₃ | 0.5 μm | 125 V | 50~80 kHz | 50% |

TABLE 4-continued

| Division | Laminate structure | Deposited thin film | Thin film composition (at %) | Layer thickness | Table Bias | Frequency | Duty cycle |
|---|---|---|---|---|---|---|---|
| | Fourth layer | TiAlN | Ti:Al = 40:60 (at %) | 1.5 μm | DC 40 V | — | 50~80% |
| Example 6 | First layer | TiAlN | Ti:Al = 40:60 (at %) | 2.5 μm | DC 40 V | — | 100% |
| | Second layer | Aluminum oxide | Al = 100, $Al_2O_3$ | 0.5 μm | 125 V | 50~80 kHz | 50% |
| | Third layer | TiAlN | Ti:Al = 40:60 (at %) | 1.5 μm | Pulse 40 V | 30 kHz | 50~80% |
| Example 7 | First layer | TiAlN | Ti:Al = 40:60 (at %) | 2.0 μm | DC 40 V | — | 100% |
| | Second layer | Aluminum oxide | Al = 100, $Al_2O_3$ | 0.5 μm | 125 V | 50~80 kHz | 50% |
| | Third layer | AlCrN | Cr:Al = 30:70 (at %) | 1.0 μm | DC 60 V | — | 100% |
| | Fourth layer | TiAlN | Ti:Al = 40:60 (at %) | 1.0 μm | Pulse 40 V | 30 kHz | 50~80% |
| Example 8 | First layer | TiAlN | Ti:Al = 50:50 (at %) | 0.5 μm | DC 30 V | — | 100% |
| | Second layer | TiAlN | Ti:Al = 40:60 (at %) | 2 μm | Pulse 40 V | 30 kHz | 50~80% |
| | Third layer | TiAlN | Ti:Al = 40:60 (at %) | 1 μm | Pulse 60 V | 30 kHz | 50~80% |
| Example 9 | First layer | TiAlN | Ti:Al = 50:50 (at %) | 0.5 μm | DC 30 V | — | 100% |
| | Second layer | TiAlN | Ti:Al = 40:60 (at %) | 2 μm | Pulse 40 V | 30 kHz | 50~80% |
| | Third layer | TiAlN | Ti:Al = 40:60 (at %) | 1 μm | DC 60 V | — | 100% |

In Table 4, in comparative example 6, a first hard layer and a second hard layer are both formed by using a DC method, and then an AlCrN layer was formed as a third hard layer, and in comparative example 7, a first hard layer and a second hard layer are both formed by using a DC method, and then an aluminum oxide layer was formed as a third hard layer.

In examples 5-9, a first hard layer was formed by using the DC method, a second hard layer was then formed by using a pulse method, and then an aluminum oxide layer or a TiAlN layer was formed as a third hard layer, or a fourth hard layer was further formed on the third hard layer to form a composite layer.

XRD Analysis Result

Figure 3:
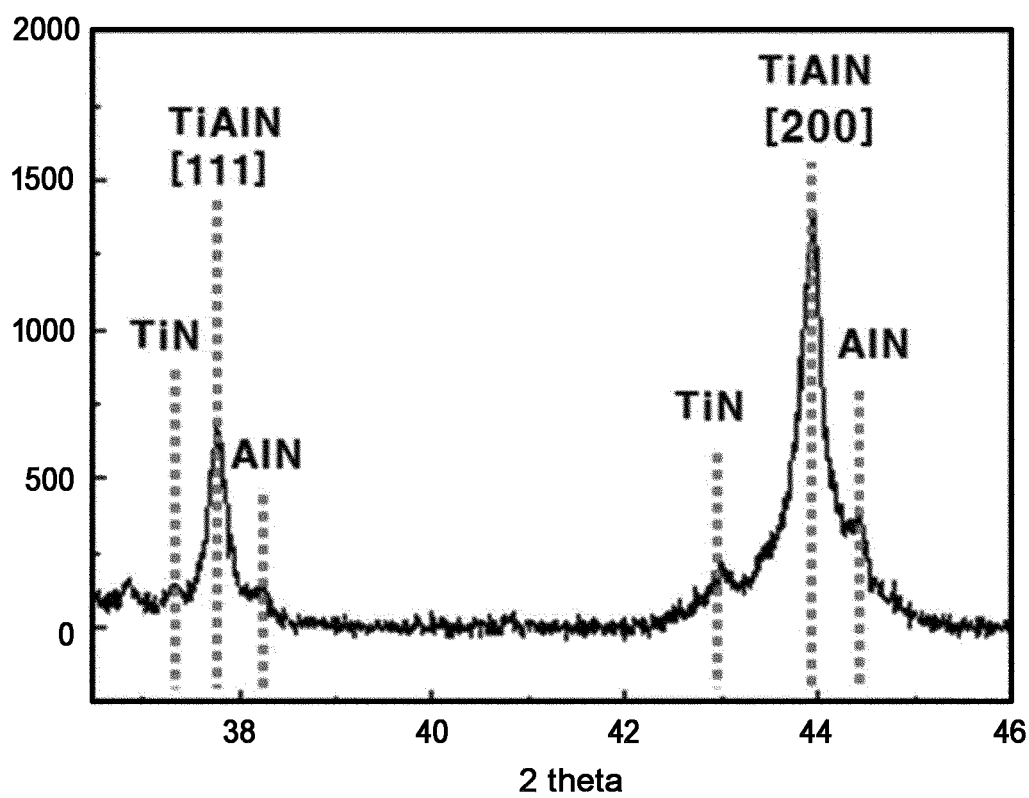
FIG. 3 illustrates an XRD analysis result of a hard film manufactured according to the first embodiment of the present invention.

With regard to the hard layers formed as such, the states of the formed hard films were analyzed by using an XRD phase analysis method, and FIG. 3 illustrates the XRD phase analysis result for the hard films according to the example 1 of the present invention.

As illustrated in FIG. 3, it was confirmed that the hard film according to example 1 of the present invention has [200] peaks were located in approximately 42.7°-44.6° and three peaks were shown, and [111] peaks were located in approximately 37.0°-38.5° and three peaks were shown. That is, the hard film according to example 1 of the present invention was shown to have a three-phase structure.

Table 5 summarizes the XRD phase analysis results of the hard films manufactured according to examples 1-3 and comparative examples 1-5, and Table 6 summarizes the XRD phase analysis results of the hard films manufactured according to examples 10-20 and comparative example 8.

Meanwhile, the XRD analysis result for a laminate structure in which a hard layer was further formed on the second hard layer are not provided, and this is because when another hard layer is formed on the second hard layer, peaks were not detected or overlapped with the second hard layer, and thus, it is difficult to consider the peaks to be from the second hard layer.

TABLE 5

| Division | [200]/ [111] | [200] Main peak Degree | [200] Sub peak 1 Degree | [200] Sub peak 2 Degree | [200] Main peak/ Sub peak 1 | [200] Main peak/ Sub peak 2 | [111] Main peak Degree | [111] Sub peak 1 Degree | [111] Sub peak 2 Degree | [111] Main peak/ Sub peak 1 | [111] Main peak/ Sub peak 2 |
|---|---|---|---|---|---|---|---|---|---|---|---|
| Comparative example 1 | 2.35 | 43.3 | 42.5 | 43.9 | 1.8 | 2.5 | 37.4 | 36.8 | 38 | 2.1 | 3.2 |
| Example 1 | 2.58 | 43.5 | 42.4 | 44.1 | 3.8 | 2.4 | 37.5 | 37.2 | 38.1 | 2.5 | 3 |
| Example 2 | 2.8 | 43.8 | 42.8 | 44.3 | 4.4 | 2.4 | 37.7 | 37.2 | 38 | 2.4 | 2.1 |
| Example 3 | 2.75 | 44 | 42.9 | 44.5 | 4.5 | 2.2 | 37.9 | 37.5 | 38.3 | | 2.7 |
| Comparative example 2 | 2.88 | 44.3 | 43.5 | 44.9 | 4.8 | 1.9 | 38 | 37.1 | 38.6 | 3.5 | 1.9 |
| Comparative example 3 | 3.99 | 43.4 | — | — | — | — | 37.4 | — | — | — | — |

As shown in Table 5, comparative examples 3 and 5 were shown not to have a three-phase mixed structure, and in comparative example 1, main peaks of [200] and [111] had intensities with not so large difference compared to sub-peaks in a three-phase mixed structure, and thus, comparative example 1 has a form in which the ratio of the secondary phases grown in the [200] direction is higher than examples of the present invention.

As shown in Table 6 above, it was shown that comparative example 8 did not have a three-phase mixed structure and examples 10-20, in which a small quantity of metal components were added to TiAlN of the second hard layer, all had three-phase mixed structures. In addition, in examples 10-20 of the present invention, the ratio [200]/[111] was no less than approximately 2 and a preferential growth occurred toward [200] in all examples, and in three-phase mixed

TABLE 6

| Division | [200]/ [111] | [200] Main peak Degree | [200] Sub peak 1 Degree | [200] Sub peak 2 Degree | [200] Main peak/ Sub peak 1 | [200] Main peak/ Sub peak 2 | [111] Main peak Degree | [111] Sub peak 1 Degree | [111] Sub peak 2 Degree | [111] Main peak/ Sub peak 1 | [111] Main peak/ Sub peak 2 |
|---|---|---|---|---|---|---|---|---|---|---|---|
| Example 10 | 2.7 | 43.8 | 42.7 | 44.3 | 3.5 | 3.1 | 37.7 | 37.2 | 38.1 | 2.5 | 2.1 |
| Example 11 | 2.75 | 43.9 | 42.9 | 44.6 | 4.5 | 3.1 | 37.9 | 37.4 | 38.4 | 2.9 | 2.5 |
| Example 12 | 2.52 | 44.1 | 43 | 44.6 | 6.2 | 5.3 | 37.9 | 37.4 | 38.4 | 3.4 | 4.1 |
| Example 8 | 2.6 | 44.3 | — | — | — | — | 38.1 | — | — | — | — |
| Example 13 | 2.6 | 43.9 | 42.9 | 44.4 | 5.8 | 3.4 | 37.5 | 37.1 | 38.2 | 2.7 | 2.2 |
| Example 14 | 2.7 | 44.1 | 42.9 | 44.4 | 4.5 | 3.8 | 37.6 | 37.1 | 38 | 2.8 | 2.1 |
| Example 15 | 2.8 | 43.9 | 42.7 | 44.3 | 5.8 | 5.1 | 37.4 | 37.1 | 38.1 | 2.2 | 2.2 |
| Example 16 | 2.9 | 43.8 | 42.8 | 44.3 | 6.1 | 4.5 | 37.4 | 37.2 | 38.1 | 2.3 | 2.4 |
| Example 17 | 2.6 | 43.7 | 42.8 | 44.2 | 8 | 3.2 | 37.8 | 37.3 | 38.3 | 2.4 | 2.1 |
| Example 18 | 2.55 | 43.8 | 43 | 44.4 | 7.5 | 4.8 | 37.5 | 37.1 | 37.9 | 2.1 | 2.2 |
| Example 19 | 2.65 | 43.8 | 42.7 | 44.6 | 7.5 | 5.8 | 37.7 | 37.2 | 38.1 | 2.5 | 2.2 |
| Example 20 | 2.7 | 44 | 42.9 | 44.6 | 5.6 | 2.4 | 37.7 | 37.3 | 38.4 | 2.5 | 2.4 | structures, the intensity of the main peak were shown to be remarkably larger than those of the sub-peaks. That is, there is shown a form in which some secondary phases are mixed to the primary phase.

Cutting Performance Test Result

With respect to the hard films formed as described above, a milling wear resistance test and a milling shock resistance test were performed and the cutting performance was evaluated.

The I/S model number used in the milling wear resistance test was APMT1604PDSR-MM of KORLOY Co., the cutter model number was AMC3063HS, and the I/S model number used in the milling shock resistance test was SPKN1504EDSR-SU of KORLOY Co. and the cutter model number was EPN5125R.

(1) Milling wear resistance characteristic evaluation conditions

Work piece: SCM440(100×200×300 mm)
Cutting speed: 250 m/min
Feed per tooth: 0.1 mm/tooth
Depth of cut: 10 mm
Radial depth of cut: 5 mm
Dry type is applied (2) Milling shock resistance characteristic evaluation conditions Work piece: SCM44O (100×200×300 mm)
Cutting speed: 200 m/min
Feed per tooth: 0.35 mm/tooth
Depth of cut: 3 mm
Radial depth of cut: 100 mm
Dry type is applied.

The above cutting performance test results are arranged in table 7 below.

TABLE 7

| Division | Cutting performance evaluation result | | | |
|---|---|---|---|---|
| | Milling wear resistance(cm) | | Milling shock resistance/ Toughness(cm) | |
| Comparative example 1 | 1800 | Excessive wear | 800 | Chipping |
| Example 1 | 2000 | Normal wear | 800 | Chipping |
| Example 2 | 2400 | Normal wear | 800 | Chipping |
| Example 3 | 2400 | Normal wear | 800 | Chipping |
| Comparative example 2 | 1000 | Initial chipping | 800 | Chipping |
| Comparative example 3 | 2400 | Normal wear | 400 | Chipping |
| Comparative example 4 | 1000 | Initial chipping | 400 | Chipping |
| Comparative example 5 | 2400 | Normal wear | 450 | Chipping |
| Comparative example 6 | 2800 | Normal wear | 550 | Chipping |
| Comparative example7 | 2800 | Normal wear | 550 | Chipping |
| Example 4 | 2800 | Normal wear | 1000 | Chipping |
| Example 5 | 2800 | Normal wear | 1000 | Chipping |
| Example 6 | 2800 | Normal wear | 1000 | Chipping |
| Example 7 | 2850 | Normal wear | 1100 | Chipping |
| Example 8 | 2600 | Normal wear | 850 | Chipping |
| Example 9 | 2600 | Normal wear | 850 | Chipping |
| Example 10 | 2400 | Normal wear | 800 | Chipping |
| Example 11 | 2400 | Normal wear | 800 | Chipping |
| Example 12 | 2450 | Normal wear | 750 | Chipping |
| Comparative example 8 | 2450 | Wear, chipping | 400 | Sudden fracture |
| Example 13 | 2300 | Normal wear | 900 | Chipping |
| Example 14 | 2400 | Normal wear | 800 | Chipping |
| Example 15 | 2450 | Normal wear | 800 | Chipping |
| Example 16 | 2500 | Normal wear | 900 | Chipping |

TABLE 7-continued

| Division | Cutting performance evaluation result | | | |
|---|---|---|---|---|
| | Milling wear resistance(cm) | | Milling shock resistance/ Toughness(cm) | |
| Example 17 | 2350 | Normal wear | 700 | Chipping |
| Example 18 | 2300 | Normal wear | 700 | Chipping |
| Example 19 | 2400 | Normal wear | 800 | Chipping |
| Example 20 | 2300 | Normal wear | 800 | Chipping |

As shown in Table 7, in the case of comparative examples land 2 which have the same laminate structure and a three-phase mixed structure as those in examples 1-3 of the present invention, but depart from the composition range claimed in claims of the present invention, excessive wear occurs or initial chipping occurs, whereas in examples 1-3 according to the present invention, a phenomenon such as those occurred in examples 1 and 2 does not occur and the milling wear resistance was shown to be remarkably improved.

In addition, comparative examples 3 and 5 which do not have a three-phase mixed structure were shown to have excellent milling wear resistance but have remarkably inferior milling shock resistance, and comparative example 4, which has a three-phase mixed structure but a first hard layer of which does not have a single layer structure, was shown to have remarkably inferior milling wear resistance due to occurrence of initial chipping. Thus, compared to comparative examples 3 and 5 which are provided with laminate structures which are commercialized and used, examples of the present invention was shown to have both the milling wear resistance and the milling shock resistance, and thus have remarkably improved cutting performance.

In addition, comparative example 6, which is a commercialized type and in which a first hard layer and a second hard layer are formed by using the DC method, the second hard layer does not have a three-phase mixed structure, and a third hard layer is formed, was shown to have further improved milling wear resistance due to the formation of the third hard layer, but have a low milling shock resistance, and likewise, comparative example 7, which is a commercialized type and in which an aluminum oxide layer is formed as second hard layer, was shown to have excellent milling wear resistance, but have a low milling shock resistance. Thus, examples of the present invention were shown to have improved cutting performance compared to commercialized comparative examples 6 and 7.

In addition, comparative example 8 which is commercialized and in which Si was added to exceed approximately 5 at % was shown to have excellent milling wear resistance but have a low milling wear shock resistance due to abrupt fracture. However, examples of the present invention compared to the comparative example 8 was shown to have both improved milling wear resistance and milling shock resistance compared to the commercialized hard film.

In a hard film according to the present invention, a second hard layer is formed which has a three-phase mixed crystal structure including, on a first hard layer having excellent binding force with a base material, a phase preferentially grown in a specific crystalline direction, and in which the ratio between a primary phase and a secondary phase is controlled, and thus, it is possible to achieve wear resistance and toughness further improved than those of cutting tools on which TiAlN layers are formed.

What is claimed is:

1. A hard film formed by using a PVD method on a surface of a base material, the hard film comprising:

a first hard layer having a thickness of approximately 0.1-3.0 μm and comprising $Ti_{1-a}Al_aN$ ($0.3 \leq a \leq 0.7$), the first hard layer a single phase; and a second hard layer having a thickness of approximately 0.5-10 μm and being composed of $Ti_{1-a-b}Al_aMe_bN$ ($0.3 \leq a \leq 0.7$, $0 \leq b \leq 0.05$, and the Me is at least one selected from V, Zr, Si, Nb, Cr, Mo, Hf, Ta and W), the second hard layer consisting of a single layer including three phases, wherein, according to an XRD phase analysis for the second hard layer, a ratio ([200]/[111]) of an intensity of a [200] peak to an intensity of a [111] peak is approximately 1.5 or higher, wherein the second hard layer preferentially grows in a [200] direction, wherein the [200] peak is located at approximately 42.7°-44.6°, wherein the [111] peak is located at approximately 37.0°-38.5°, wherein, when a peak having a largest intensity among peaks in the three phases of the second hard layer is a main peak and remaining peaks are sub-peaks, a ratio of an intensity of the main peak to an intensity of any one of the sub-peaks in a [200] face is approximately 2 or higher, and wherein a ratio of the intensity of the main peak to an intensity of any one of the sub-peaks in a [111] face is approximately 2 or higher.

2. The hard film of claim 1, wherein a third hard layer is formed on the second hard layer, the third hard layer having a structure of a single layer including one or more compounds selected from $Al_{1-x}Cr_xN$ ($0.3 \leq x \leq 0.7$), $Al_{1-y}Ti_yN$ ($0.3 \leq y \leq 0.7$), and $Al_2O_3$, or having a composite layer structure in which at least two single layers are laminated.

3. The hard film of claim 1, wherein a fourth hard layer is formed between the first hard layer and the second hard layer, the fourth hard layer having a structure of a single layer including one or more compounds selected from $Al_{1-x}Cr_xN$ ($0.3 \leq x \leq 0.7$), $Al_{1-y}Ti_yN$ ($0.3 \leq y \leq 0.7$), and $Al_2O_3$, or having a composite layer structure in which at least two single layers are laminated.

4. The hard film of claim 1, wherein the ratio of the intensity of the main peak to the intensity of any one of the sub-peaks in the [200] face is approximately 3-8, and wherein the ratio of the intensity of the main peak to the intensity of any one of the sub-peaks in the [111] face is approximately 4-7.

* * * * *